(12) United States Patent  
Lee

(10) Patent No.: US 8,921,139 B2
(45) Date of Patent: Dec. 30, 2014

(54) MANUFACTURING METHOD OF ORGANIC LIGHT EMITTING DIODE DISPLAY

(71) Applicant: Samsung Display Co., Ltd., Yongin (KR)

(72) Inventor: Jae-Young Lee, Yongin (KR)

(73) Assignee: Samsung Display Co., Ltd., Yongin (KR)

(*) Notice: Subject to any disclaimer, the term of this patent is extended or adjusted under 35 U.S.C. 154(b) by 0 days.

(21) Appl. No.: 13/971,407

(22) Filed: Aug. 20, 2013

(65) Prior Publication Data

US 2014/0329345 A1 Nov. 6, 2014

(30) Foreign Application Priority Data

May 2, 2013 (KR) .................. 10-2013-0049439

(51) Int. Cl.
*H01L 21/00* (2006.01)
*H01L 21/66* (2006.01)
*H01L 51/56* (2006.01)

(52) U.S. Cl.
CPC ............... *H01L 51/56* (2013.01); *H01L 22/14* (2013.01)
USPC 438/35; 257/40; 257/E21.007; 257/E21.024; 438/18; 438/22; 438/82; 438/89

(58) Field of Classification Search
USPC ......... 257/40, E21.007, E21.024; 438/18, 22, 438/35, 82, 99
See application file for complete search history.

(56) References Cited

U.S. PATENT DOCUMENTS

2006/0087327 A1* 4/2006 Ueno et al. .................... 324/713
2006/0279297 A1* 12/2006 Nystrom et al. ............... 324/754
2009/0070995 A1* 3/2009 Kumagai ........................ 29/846

FOREIGN PATENT DOCUMENTS

| JP | 2008-159347 | 7/2008 |
| KR | 10-2007-0098314 | 10/2007 |
| KR | 10-2009-0128682 | 12/2009 |

* cited by examiner

*Primary Examiner* — Asok K Sarkar
(74) *Attorney, Agent, or Firm* — H.C. Park & Associates, PLC

(57) ABSTRACT

A manufacturing method of an organic light emitting diode (OLED) display includes manufacturing a mother substrate including a plurality of panels formed with a plurality of anodes for each pixel and a test pad connected to each anode of the panel. The method further includes loading the mother substrate into a plasma chamber and applying a plasma voltage to the test pad of the mother substrate to perform a plasma surface treatment process. The test pad is applied with a different plasma voltage for each pixel.

13 Claims, 4 Drawing Sheets

MANUFACTURING METHOD OF ORGANIC LIGHT EMITTING DIODE DISPLAY

CROSS REFERENCE TO RELATED APPLICATION

This application claims priority from and the benefit of Korean Patent Application No. 10-2013-0049439, filed on May 2, 2013, which is hereby incorporated by reference for all purposes as if fully set forth herein.

BACKGROUND

1. Field

Exemplary embodiments of the present disclosure relate to a manufacturing method of an organic light emitting diode (OLED) display.

2. Description of the Background

An organic light emitting diode display includes two electrodes and an organic emission layer interposed therebetween. Electrons from one electrode (i.e., cathode) may combine with holes from another electrode (i.e., anode) in the organic emission layer to form excitons. As a result of the combination, light may be emitted when the excitons discharge energy.

The anode of the organic light emitting diode (OLED) display is formed of a transparent material, such as ITO (indium tin oxide) or IZO (indium zinc oxide). The anode may be cleansed after being formed, and may then be treated by an oxygen ($O_2$) plasma surface treatment process. The oxygen plasma surface treatment process reduces a work function of the anode to increase an injection amount of the holes and removes a remaining layer at the anode thereby improving driving performance, such as a driving voltage, a voltage-current density curve, luminous efficiency, and lifespan.

However, a conventional oxygen plasma surface treatment process does not distinguish pixels according to color. The plasma process may be performed on an entire mother substrate in which the anode is formed, but may not control a surface characteristic of the anode such as a hole injection amount for the pixels of each color. As a result, optimized surface characteristics for the pixels of each color may not be controlled.

The above information disclosed in this Background section is only for enhancement of understanding of the background of the disclosed subject matter, and therefore may contain information that does not form the prior art that is already known to a person of ordinary skill in the art.

SUMMARY

Exemplary embodiments of the present disclosure provide a manufacturing method of an organic light emitting diode (OLED) display having optimized driving performance for each pixel by differently applying a surface treatment process using oxygen plasma for a red pixel, a green pixel, and a blue pixel.

Additional features of the present disclosure will be set forth in the description which follows, and in part will be apparent from the description, or may be learned by practice of the disclosed subject matter.

Exemplary embodiments of the present disclosure disclose a manufacturing method of an organic light emitting diode (OLED) display. The method includes forming a mother substrate including a plurality of panels formed with a plurality of anodes for each pixel in the substrate and a test pad connected to each anode of the panels; and applying a plasma voltage to the test pad to perform a plasma surface treatment process. Applying a plasma voltage to the test pad includes applying a first plasma voltage for a first pixel of the pixels and a second plasma voltage for a second pixel of the pixels.

Exemplary embodiments of the present disclosure also disclose a method for performing a plasma process on a mother substrate comprising a plurality of pixels. The method includes applying, via a test pad of the mother substrate, a first voltage to one of a first pixel associated with a first color, a second pixel associated with a second color, and a third pixel associated with a third color, and applying a second voltage to a different one of the first pixel, the second pixel, and the third pixel via the test pad, the second voltage being different from the first voltage.

It is to be understood that both the foregoing general description and the following detailed description are exemplary and explanatory and are intended to provide further explanation of the disclosed subject matter as claimed.

BRIEF DESCRIPTION OF THE DRAWINGS

The accompanying drawings, which are included to provide a further understanding of the disclosed subject matter and are incorporated in and constitute a part of this specification, illustrate exemplary embodiments of the disclosed subject matter, and together with the description serve to explain the principles of the disclosed subject matter.

DETAILED DESCRIPTION OF THE ILLUSTRATED EMBODIMENTS

Figure 1:
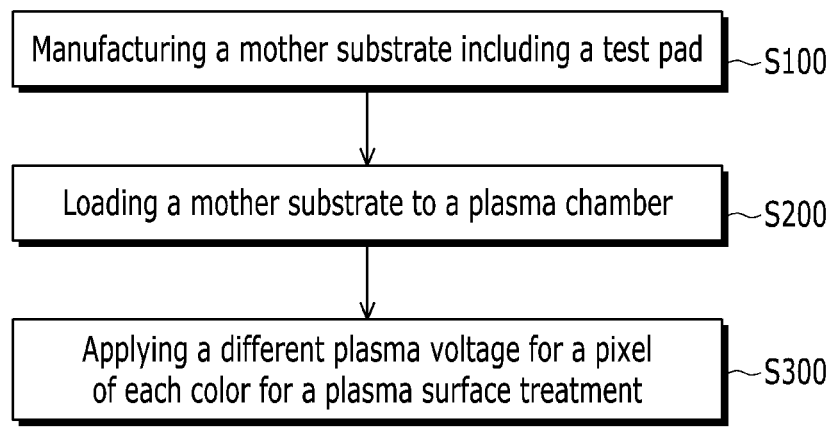
FIG. 1 is a flowchart of a manufacturing method of an organic light emitting diode (OLED) display according to exemplary embodiments of the present disclosure.

Exemplary embodiments of the disclosed subject matter are described more fully hereinafter with reference to the accompanying drawings. The disclosed subject matter may, however, be embodied in many different forms and should not be construed as limited to the exemplary embodiments set forth herein. Rather, the exemplary embodiments are provided so that this disclosure is thorough and complete, and will convey the scope of the disclosed subject matter to those skilled in the art. In the drawings, the size and relative sizes of layers and regions may be exaggerated for clarity. Like reference numerals in the drawings denote like elements.

It will be understood that when an element or layer is referred to as being "on", "connected to", or "coupled to" another element or layer, it can be directly on, connected, or coupled to the other element or layer or intervening elements or layers may be present. In contrast, when an element is referred to as being "directly on," "directly connected to", or "directly coupled to" another element or layer, there are no intervening elements or layers present. As used herein, the term "and/or" includes any and all combinations of one or more of the associated listed items. It may also be understood that for the purposes of this disclosure, "at least one of X, Y, and Z" can be construed as X only, Y only, Z only, or any combination of two or more items X, Y, and Z (e.g., XYZ, XYY, YZ, ZZ).

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another region, layer or section. Thus, a first element, component, region, layer, or section discussed below could be termed a second element, component, region, layer, or section without departing from the teachings of the present disclosure.

The terminology used herein is for the purpose of describing exemplary embodiments only and is not intended to be limiting of the disclosed subject matter. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the disclosed subject matter are described herein with reference to cross-section illustrations that are schematic illustrations of idealized embodiments (and intermediate structures) of the disclosed subject matter. As such, variations from the shapes of the illustrations as a result, for example, of manufacturing techniques and/or tolerances, are to be expected. Thus, exemplary embodiments of the disclosed subject matter should not be construed as limited to the particular shapes of regions illustrated herein but are to include deviations in shapes that result, for example, from manufacturing.

Hereinafter, exemplary embodiments of the disclosed subject matter will be described in detail with reference to the accompanying drawings. An organic light emitting diode (OLED) display according to exemplary embodiments will be described with reference to FIGS. 1, 2, and FIG. 3.

Figure 2:
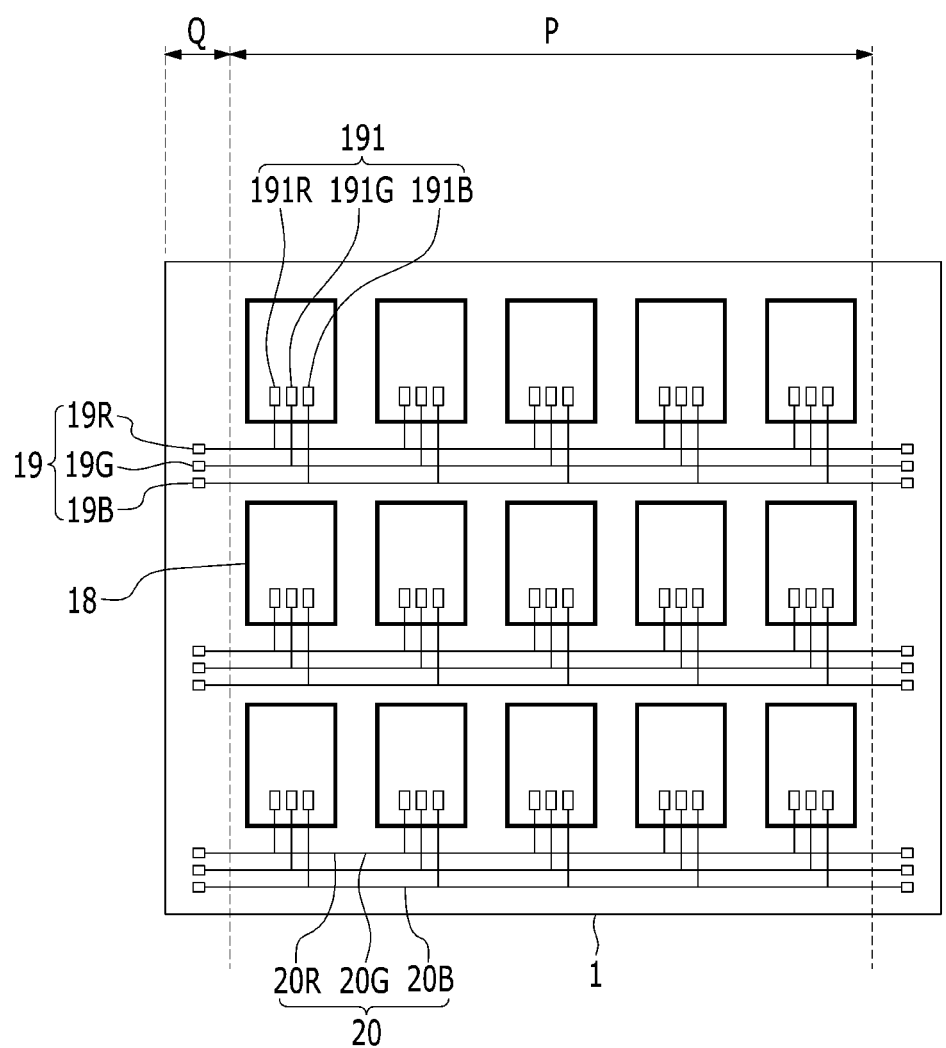
FIG. 2 is a top plan view of a mother substrate according to exemplary embodiments of the present disclosure.

As shown in FIG. 1 and FIG. 2, in a manufacturing method of an organic light emitting diode (OLED) display according to exemplary embodiments, a mother substrate 1 having a test pad 19 may be manufactured (S100).

The mother substrate 1 may include a plurality of panels 18 formed with a plurality of anodes 191, a test pad 19 connected to each anode 191 of the panels 18, and a connection line 20 connecting the anode 191 and the test pad 19. In general, the plurality of panels 18 may be formed at a center portion P of the mother substrate 1, and the test pad 19 may be formed at an edge portion Q of the mother substrate 1. However, it should be understood that the panels 18 and test pad 19 may be formed in any suitable portion of the substrate 1.

The panels 18 are formed to be separated from each other on the mother substrate 1, and are separated from the mother substrate 1 in a final completion step of the organic light emitting diode (OLED) display. Horizontal and vertical cut lines, used in separating the panels 18 from each other, are not shown in FIG. 2 to avoid unnecessarily obscuring the drawing. Furthermore, although each panel 18 is shown with only three anodes 191, it should be understood that each panel 18 includes thousands or millions of anodes 191, depending on the panel's resolution.

The anodes 191 may be made of a transparent material such as ITO (indium tin oxide) or IZO (indium zinc oxide). A switching thin film transistor T1 and a driving thin film transistor T2 may be formed under the anode 191, and a driving voltage may be applied to the anode 191 by using these transistors T1 and T2.

The test pad 19 may include a red test pad 19R, a green test pad 19G, and a blue test pad 19B, respectively, connected to a red pixel (R), a green pixel (G), and a blue pixel (B). The connection line 20 may include a red connection line 20R connecting the red pixel (R) to the red test pad 19R via anode 191R, a green connection line 20G connecting the green pixel (G) to the green test pad 19G via anode 191G, and a blue connection line 20B connecting the blue pixel (B) to the blue test pad 19 via anode 191B. Although each panel 18 is shown with anodes 191 of three pixels, a person having ordinary skill in the art understands that all red pixels on each panel 18 may be connected to the corresponding red test pad 19R via the red connection line 20R, all green pixels on each panel 18 may be connected to the corresponding green test pad 19G via the green connection line 20G, and all blue pixels on each panel 18 may be connected to the corresponding blue test pad 19B via the blue connection line 20B.

The test pad 19 may apply a test voltage for performing a test on the mother substrate 1, and may be used to apply a plasma voltage for a plasma surface treatment.

Figure 3:
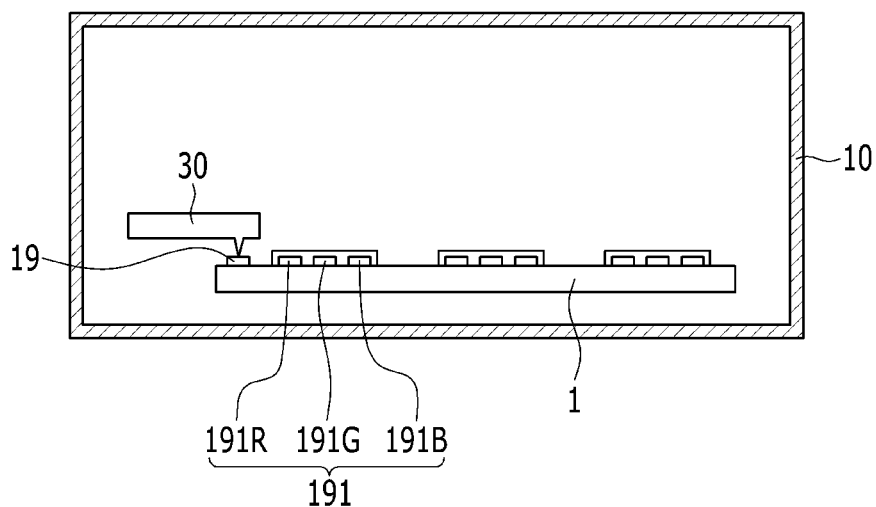
FIG. 3 is a view of a state of applying a plasma voltage to a mother substrate according to exemplary embodiments of the present disclosure.

Next, as shown in FIG. 1 and FIG. 3, the manufactured mother substrate 1 may be inserted into a plasma chamber 10 in which an oxygen plasma process is performed (S200). The mother substrate 1 may be loaded into the plasma chamber 10 by using any suitable transfer unit. Then, a plasma voltage is applied to the test pad 19 of the mother substrate 1 to perform an oxygen plasma surface treatment process (S300). A probe pin 30 may contact the test pad 19 of the mother substrate 1 to apply the plasma voltage. The oxygen plasma surface treatment process has a function of providing hydrophilicity to the surface of the anode 191 by using negative oxygen ions, and reducing a work function.

In applying the plasma voltage to the test pad 19, different plasma voltages may be applied to the test pad 19 for various pixels. For example, a different plasma voltage may be applied to each of the red test pad 19R, the green test pad 19G, and the blue test pad 19B. In this case, different voltages may be applied to the red pixel (R), the green pixel (G), and the blue pixel (B) such that a degree that the surface is etched by the negative oxygen ions is different for the pixels of each color.

For example, when the blue pixel (B) has a large hole injection amount compared with a pixel of a different color such that the luminous efficiency is low, a lower voltage than that of the red test pad 19R and the green test pad 19G may be applied to the blue test pad 19B during the plasma surface treatment process such that the blue pixel (B) is more weakly etched by the negative oxygen ions. Accordingly, a reduction width of the work function in the blue pixel (B) is smaller than a reduction width of the red pixel (R) and the green pixel (G), and the hole injection amount is decreased such that a balance with an electron injection amount is adjusted, thereby improving luminous efficiency.

In contrast, when the blue pixel (B) has a small hole injection amount compared with a pixel of a different color such that the luminous efficiency is low, a higher voltage than that of the red test pad 19R and the green test pad 19G may be applied to the blue test pad 19B in the plasma surface treatment process such that the blue pixel (B) is etched more by the negative oxygen ions. Accordingly, the reduction width of the work function in the blue pixel (B) is larger than the reduction width of the red pixel (R) and the green pixel (G), and the hole injection amount is increased such that the balance with the electron injection amount is adjusted, thereby improving luminous efficiency.

The plasma voltage applied to each pixel may be determined by using a hole only device (HOD) or an electron only device (EOD) for measuring the hole injection amount or the electron injection amount.

As described above, by applying the different plasma voltages to the test pad 19 of the mother substrate 1 for the pixels of various colors, the plasma surface treatment is different for the pixels of each color such that the work function of the anode 191 may be different for the pixels of each color. Accordingly, by differently controlling the hole injection amount for the pixels of each color, the driving performance, such as the driving voltage, the luminous efficiency, and the life-span, may be optimized for the pixels of each color.

Next, the edge portion Q formed with the test pad 19 may be cut. Accordingly, an external electrostatic inflow may be prevented, and the area of the organic light emitting diode (OLED) display may be minimized.

Figure 4:
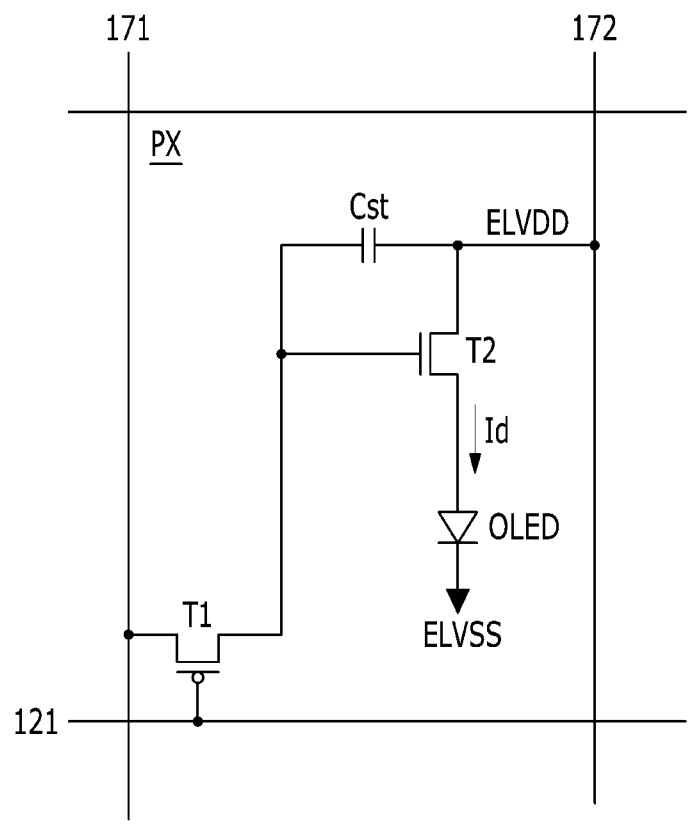
FIG. 4 is an equivalent circuit of an organic light emitting diode (OLED) display according to exemplary embodiments of the present disclosure.

FIG. 4 is an equivalent circuit of a pixel PX in an organic light emitting diode (OLED) display according to exemplary embodiments.

As shown in FIG. 4, a pixel PX in an organic light emitting diode (OLED) display may include a plurality of signal lines 121, 171, and 172. The pixel PX may be representative of a plurality of pixels PX in the OLED display that is arranged in an approximate matrix form.

The signal lines may include a plurality of scan lines 121 for transmitting scan signals (or gate signals), a plurality of data lines 171 for transmitting data signals, and a plurality of driving voltage lines 172 for transmitting a driving voltage ELVDD. The scan lines 121 run parallel with each other in a row direction, and the data lines 171 and the driving voltage lines 172 run parallel with each other in a column direction. Each pixel PX includes a switching thin film transistor T1, a driving thin film transistor T2, a storage capacitor Cst, and an organic light emitting diode (OLED).

The switching thin film transistor T1 has a control terminal, an input terminal, and an output terminal. The control terminal is connected to the scan line 121, the input terminal is connected to the data line 171, and the output terminal is connected to a control terminal of the driving thin film transistor T2. The switching thin film transistor T1 transmits a data signal applied to the data line 171 to the driving thin film transistor T2 in response to a scan signal applied to the scan line 121.

The driving thin film transistor T2 also has a control terminal, an input terminal, and an output terminal. The control terminal is connected to the switching thin film transistor T1, the input terminal is connected to the driving voltage line 172, and the output terminal is connected to the organic light emitting diode OLED. The driving thin film transistor T2 causes output current Id to flow, which varies in amplitude in accordance with a voltage applied between the control terminal and the output terminal.

The storage capacitor Cst is connected between the control terminal and input terminal of the driving thin film transistor T2. The storage capacitor Cst charges a data signal applied to the control terminal of the driving thin film transistor T2, and maintains the data signal after the switching thin film transistor T1 is turned off.

The organic light emitting diode OLED has an anode connected to the output terminal of the driving thin film transistor T2 and a cathode connected to a common voltage ELVSS. The organic light emitting diode OLED displays an image by emitting light with different intensity according to an output current Id of the driving thin film transistor T2.

The switching thin film transistor T1 and the driving thin film transistor T2 may be n-channel field effect transistors (FETs) or p-channel field effect transistors. The connection relationship among the thin film transistors T1 and T2, the storage capacitor Cst, and the organic light emitting diode OLED may vary.

It will be apparent to those skilled in the art that various modifications and variations can be made in the present disclosure without departing from the spirit or scope of the disclosed subject matter. Thus, it is intended that the present disclosure cover the modifications and variations of the disclosed subject matter provided they come within the scope of the appended claims and their equivalents.

What is claimed is:

1. A manufacturing method of an organic light emitting diode (OLED) display, comprising:
    forming a mother substrate comprising:
        a plurality of panels formed with a plurality of anodes for each pixel in the mother substrate; and
        a test pad connected to each anode of the panels; and
    applying a plasma voltage to the test pad to perform a plasma surface treatment process,
    wherein applying a plasma voltage to the test pad comprises applying a first plasma voltage for a first pixel of the pixels and a second plasma voltage for a second pixel of the pixels, and
    wherein the first plasma voltage is different than the second plasma voltage.

2. The method of claim 1, wherein:
    the test pad comprises a red test pad connected to a red pixel, a green test pad connected to a green pixel, and a blue test pad connected to a blue pixel; and
    one of the red test pad, the green test pad, and the blue test pad is applied with a different plasma voltage relative to a plasma voltage applied to a different one of the red test pad, the green test pad, and the blue test pad.

3. The method of claim 1, wherein forming the substrate comprises:
    forming the plurality of anodes in each panel; and
    forming the test pad at an edge portion of the mother substrate.

4. The method of claim 3, wherein applying the plasma voltage comprises:
    applying the plasma voltage to the test pad via a probe pin.

5. The method of claim 3, further comprising
    cutting the edge portion of the mother substrate.

6. The method of claim 3, wherein forming the plurality of anodes in each panel comprises forming a first anode in a red pixel, forming a second anode in a blue pixel, and forming a third anode in a green pixel.

7. The method of claim 1, wherein the first pixel is one of a red pixel, a blue pixel, and a green pixel, and the second pixel is another pixel having a color different than the first pixel.

8. The method of claim 1, wherein applying the plasma voltage to the test pad comprises applying a different plasma voltage for each type of pixel, the type of pixel being associated with a color of the pixel.

9. A method for performing a plasma process on a mother substrate comprising a plurality of pixels, the method comprising:
    applying, via a test pad of the mother substrate, a first voltage to one of a first pixel associated with a first color, a second pixel associated with a second color, and a third pixel associated with a third color; and applying, via the test pad, a second voltage to a different one of the first pixel, the second pixel, and the third pixel the second voltage being different from the first voltage.

10. The method of claim 9, further comprising:

forming the mother substrate comprising the test pad and a plurality of panels, each of the panels comprising a plurality of anodes, the plurality of anodes comprising a first anode, a second anode, and a third anode, wherein the first anode is disposed in the first pixel, the second anode is disposed in the second pixel, and the third anode is disposed in the third pixel.

11. The method of claim 10, wherein the test pad comprises a first test pad, a second test pad, and a third test pad, and wherein the first test pad is coupled to the first pixel via the first anode, the second test pad is coupled to the second pixel via the second anode, and the third test pad is coupled to the third pixel via the third anode.

12. The method of claim 9, wherein forming the mother substrate comprises forming a connection line to connect the test pad to the plurality of the anodes, and wherein the first voltage and second voltage are applied via the connection line.

13. The method of claim 9, wherein the first color comprises a red color, the second color comprises a green color, and the third color comprises a blue color.

* * * * *